United States Patent
Pirchheim et al.

(10) Patent No.: US 10,126,455 B2
(45) Date of Patent: Nov. 13, 2018

(54) DEVICE FOR THE CONTACTLESS ACTUATION OF AN ADJUSTABLE VEHICLE PART

(71) Applicant: Brose Fahrzeugteile GmbH & Co. Kommanditgesellschaft, Bamberg, Bamberg (DE)

(72) Inventors: Florian Pirchheim, Miesbach (DE); Jonas Reich, Ebern (DE)

(73) Assignee: Brose Fahrzeugteile GmbH & Co. Kommanditgesellschaft, Bamberg, Bamberg (DE)

( * ) Notice: Subject to any disclaimer, the term of this patent is extended or adjusted under 35 U.S.C. 154(b) by 0 days.

(21) Appl. No.: 15/630,417

(22) Filed: Jun. 22, 2017

(65) Prior Publication Data

US 2017/0285209 A1 Oct. 5, 2017

(30) Foreign Application Priority Data

Dec. 22, 2014 (DE) .................. 10 2014 018 923

(51) Int. Cl.
| | |
|---|---|
| *G01V 3/08* | (2006.01) |
| *E05F 15/73* | (2015.01) |
| *B60R 25/20* | (2013.01) |
| *H03K 17/955* | (2006.01) |
| *B60J 5/10* | (2006.01) |

(52) U.S. Cl.
CPC ............ *G01V 3/08* (2013.01); *B60R 25/2054* (2013.01); *E05F 15/73* (2015.01); *H03K 17/955* (2013.01); *B60J 5/101* (2013.01); *E05Y 2900/532* (2013.01); *H03K 2217/960755* (2013.01)

(58) Field of Classification Search
CPC .. G01V 3/08; E05F 15/73; B60J 5/101; E05Y 2900/532
USPC .......................................... 324/671
See application file for complete search history.

(56) References Cited

U.S. PATENT DOCUMENTS

| | | | |
|---|---|---|---|
| 8,788,152 B2 | 7/2014 | Reimann et al. | |
| 9,464,921 B2 | 10/2016 | Van Gastel | |
| 2012/0319502 A1 | 12/2012 | Van Gastel | |
| 2013/0234828 A1 | 9/2013 | Holzberg et al. | |
| 2016/0083995 A1* | 3/2016 | Dezorzi ................. | E05F 15/73 340/5.72 |

FOREIGN PATENT DOCUMENTS

| | | |
|---|---|---|
| DE | 10 2009 017 404 A1 | 11/2009 |
| DE | 10 2010 018 164 A1 | 8/2011 |

(Continued)

*Primary Examiner* — Melissa Koval
*Assistant Examiner* — Rahul Maini
(74) *Attorney, Agent, or Firm* — Muncy, Geissler, Olds & Lowe, P.C.

(57) ABSTRACT

A device for contactless actuation of an adjustable vehicle part. The device has a capacitive proximity sensor having a first elongated sensor electrode and a second elongated sensor electrode, as well as a carrier component for fastening the proximity sensor. The carrier component has a curved mounting surface on which the sensor electrodes are placed in such a way that the horizontal distance between the two sensor electrodes over the length of the sensor electrodes is exactly or at least approximately constant, the vertical distance between the sensor electrodes varying over the length of the sensor electrodes.

11 Claims, 4 Drawing Sheets

(56) References Cited

FOREIGN PATENT DOCUMENTS

| | | |
|---|---|---|
| DE | 10 2010 049 400 A1 | 4/2012 |
| DE | 10 2012 100 960 A1 | 8/2013 |
| DE | 10 2012 102 060 A1 | 9/2013 |
| WO | WO 2013/182466 A1 | 12/2013 |

* cited by examiner

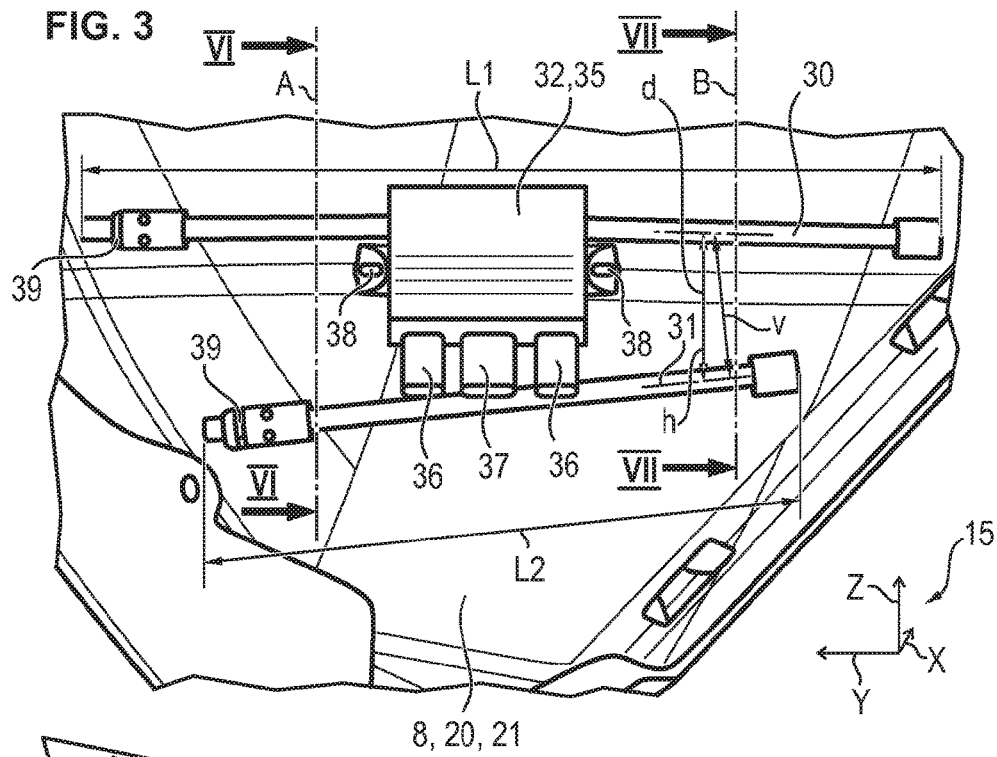
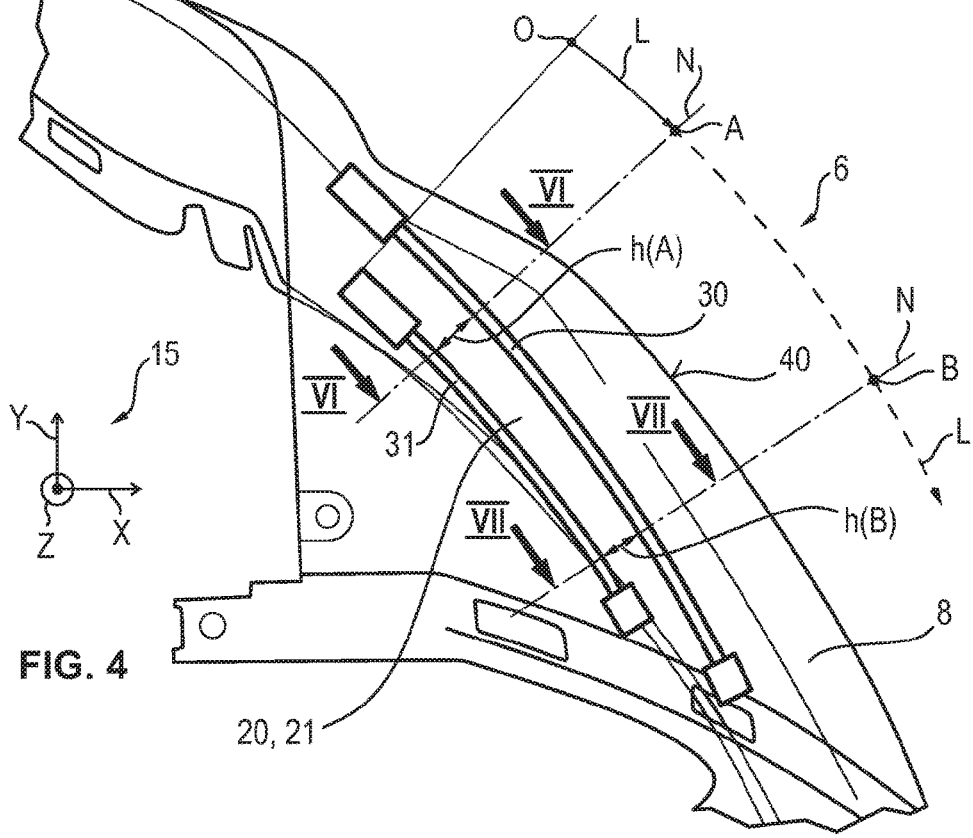

DEVICE FOR THE CONTACTLESS ACTUATION OF AN ADJUSTABLE VEHICLE PART

This nonprovisional application is a continuation of International Application No. PCT/EP2015/079700, which was filed on Dec. 15, 2015, and which claims priority to German Patent Application No. 10 2014 018 923.6, which was filed in Germany on Dec. 22, 2014, and which are both herein incorporated by reference.

BACKGROUND OF THE INVENTION

Field of the Invention

The invention relates to a device for the contactless actuation of an adjustable vehicle part, said device having a carrier component with a curved mounting surface and a proximity sensor mounted on the mounting surface. The invention relates further to a vehicle comprising the device.

Description of the Background Art

Modern vehicles are often equipped with sensors that enable the contactless adjustment of vehicle parts. For example, the contactless actuation (therefore opening or closing) of a vehicle door is made possible for a vehicle user by means of a sensor of this kind. Sensors of this kind are provided in particular in motor-driven trunk lids of motor vehicles, so that the vehicle user by an appropriate leg movement can bring about an opening or closing of the trunk lid without having to put down a load being held in the hands ("hands-free access"). This type of contactless tailgate switch is known, for example, from DE 10 2010 049 400 A1, which corresponds to US2013/0234828, which is incorporated herein by reference.

Capacitively operating proximity sensors are often used as sensors for detecting an actuation command. A capacitive proximity sensor of this kind typically comprises two sensor electrodes and an electronic unit, each of which is connected to the sensor electrodes via corresponding lines.

The proximity sensor is often attached indirectly or directly to an inner side of a rear bumper of the vehicle, whereby the typically elongated sensor electrodes conform to the spatial contour of the bumper. If the proximity sensor is located in a corner area of the bumper, this means that the sensor electrodes must be placed along a surface that often has a complex curvature.

It is disadvantageous that the reliable function of proximity sensors is often adversely impacted under these conditions. In light of experience, proximity sensors placed in the corner area of the bumper are often more prone to detection errors (failure to detect an opening command and/or incorrect interpretation of a different movement as an opening command) than proximity sensors the sensor electrodes of which are placed along a substantially flat surface.

SUMMARY OF THE INVENTION

It is therefore an object of the invention to provide a device for the contactless actuation of an adjustable vehicle part, which can be operated especially reliably (i.e., in a fail-proof manner).

In an exemplary embodiment, the device of the invention for the contactless actuation of an adjustable vehicle part comprises at least one capacitive proximity sensor, which for its part in order to detect an actuation command, generated by an approach to the proximity sensor, comprises a first sensor electrode and at least one second sensor electrode. Each sensor electrode in this case is formed by an elongated electrical conductor, for example, in form of a circular conductor or flat conductor (with a flat, band-like conductor geometry). In particular, in an advantageous embodiment, at least one of the two sensor electrodes is formed by the outer conductor of a coaxial cable or a similar cable without an inner conductor. The two sensor electrodes preferably have the same structure. Alternatively, in the context of the invention the two sensor electrodes may also have different structure.

Furthermore, the device comprises a carrier component which is used to fasten the proximity sensor in a specific installation position to a vehicle, in particular a motor vehicle. The carrier component in this case has a curved (in particular two-dimensionally curved) mounting surface on which the sensor electrodes are placed at a distance to one another, which is different from zero everywhere (i.e., fastened in a specific relative position to one another). In an advantageous embodiment of the invention, the carrier component is formed by a flat molded part, which is used exclusively for supporting the proximity sensor. Alternatively, in the context of the invention, the sensor electrodes can also be fastened directly to a vehicle part associated with the vehicle body or external cladding of the vehicle, in particular to the inner side of a (vehicle) bumper. In this case, this vehicle part, in particular the bumper, represents the aforementioned carrier component. The mounting surface of the carrier component is described as two-dimensionally curved when it is curved within each direction within the mounting surface, as, e.g., in a convex or saddle-shaped surface.

The distance formed between the two sensor electrodes placed on the mounting surface is given by the length of the shortest linear connection between a given point (position) along the longitudinal extent of one of the two sensor electrodes and the respective other sensor electrode. This (electrode) distance can be clearly determined for each point (position) along the longitudinal extent of the sensor electrodes and thereby represents a position-dependent mathematical function. Provided the two sensor electrodes have a different length, the position-dependent (electrode) distance is hereby always defined in relation to the shorter sensor electrode (therefore depending on the position along the longitudinal extent of the shorter sensor electrode).

In the installed position of the sensor electrodes on the vehicle, the electrode distance can be routinely broken down into a vertical component, which lies substantially perpendicular in the surrounding space, and a horizontal component, which lies substantially horizontally in the surrounding space, whereby these components as well each represent mathematical functions of the position along one of the sensor electrodes (or the shorter sensor electrode if applicable). The vertical component of the electrode distance will be called the "vertical distance" in short hereafter (which is position-dependent over the length of the sensor electrodes). Accordingly, the horizontal component of the electrode distance will be called the "horizontal distance" in short hereafter (which is position-dependent over the length of the sensor electrodes).

The horizontal distance in this case is in particular the distance that the first and second sensor electrodes leave free between them in an intended actuation direction of the proximity sensor. The actuation direction is the direction in which an approach event at the proximity sensor is to occur as intended so as to generate a specified actuation command.

The actuation direction is thereby oriented particularly approximately perpendicular to the longitudinal extent of the sensor electrodes; in the case of a curved placement of the sensor electrode along the mounting surface, the actuation direction therefore also changes along the longitudinal extent of the sensor electrodes. In the case of a proximity sensor located in the corner area of a bumper, the intended actuation direction is oriented in particular horizontally and at each point approximately perpendicular to the outer surface of the bumper.

According to the invention, the sensor electrodes in this case are placed on the mounting surface in such a way that in the installed position the previously defined vertical distance between the sensor electrodes placed along the mounting surface varies, so that the previously defined horizontal distance is constant exactly or at least approximately over the length of the sensor electrodes. Stated differently, the sensor electrodes are arranged on the mounting surface unparallel to one another (in particular at an angle to one another) in such a way that the horizontal distance between the sensor electrodes does not vary or varies only slightly over the length of the sensor electrodes. If here and below the "length of the sensor electrodes" is mentioned, this means the length over which the sensor electrodes overlap, when viewed transverse to their longitudinal extent.

The invention is based on the premise that conventionally the two sensor electrodes of a generic proximity sensor are placed as parallel as possible to one another (and in particular parallel to the ground). This is because in the case of a parallel placement of the sensor electrodes it is assured in many cases (particularly when the sensor electrodes are placed along a substantially flat surface) that similar approach events at different places along the longitudinal extent of the sensor electrode result in the same sensor signals, as a result of which the risk of detection errors is reduced in these cases. Even though the mounting surface of the support component, along which the sensor electrodes are placed, has a uniform curvature (e.g., cylindrical, conical, or convex, i.e., spherical), the conventional parallel placement of the sensor electrodes is not critical. The corner areas in particular of the external cladding of modern motor vehicles often have no uniform curvature. Rather the corner areas of a modern vehicle external cladding are routinely designed according to aerodynamic or aesthetic viewpoints and therefore often have irregular curvature shapes (e.g., in the form of ribs or protrusions).

The sensor electrodes, placed usually parallel to one another on the accordingly irregularly curved mounting surface, based on experience are especially susceptible to detection errors. This is because, due to the irregular curvature of the mounting surface, the horizontal distance of the sensor electrodes (therefore the horizontal component of the electrode distance) varies uniformly over the length of the sensor electrodes. Thus, and because during the placement of the sensor electrode along the curved mounting surface, the vertical distance between the sensor electrodes is varied deliberately over the length thereof, keeping the horizontal distance exactly or at least approximately constant is made possible. Tests in this case have shown surprisingly that keeping the horizontal distance at least approximately constant greatly improves the reliability of the proximity sensor, whereas the accepted variation in the vertical distance does not greatly affect the reliability of the proximity sensor.

The term 'approximately constant' is used to describe the horizontal distance between the sensor electrodes in suitable dimensioning, if the horizontal distance deviates by no more than 10% from the average value of the horizontal distance over the length of the sensor electrodes.

The vertical distance, in contrast, deviates in particular by more than 10% from its average value over the length of the sensor electrodes.

In an embodiment, each sensor electrode is curved only in one dimension, so that each sensor electrode extends at least approximately within an associated flat plane. Stated differently, all points of one of the sensor electrodes lie at least approximately in an associated flat plane. The planes in this case are positioned at a, particularly acute, angle to one another.

In an embodiment, in this regard (in the installed state) one of the sensor electrodes lies exactly or at least approximately in a horizontal plane; i.e., it has over its entire length more or less the same height above the ground on which the vehicle is standing. This design is advantageous in particular for a proximity sensor, used for the contactless actuation of a vehicle door. Preferably, the horizontally oriented sensor electrode is disposed above the other sensor electrode with respect to the vehicle vertical.

One of the sensor electrodes can be longer than the other sensor electrode, whereby a lengthwise overhang between the two sensor electrodes is preferably about the same at both longitudinal ends. This difference in length advantageously makes it possible to differentiate between approach events that occur in the actuation direction (therefore transverse to the longitudinal extent of the sensor) and such approach events that occur substantially along the longitudinal extent of the sensor.

The adjustable vehicle part concerns preferably a trunk lid of the vehicle. It is also conceivable in general, however, that the adjustable vehicle part is a different vehicle door, e.g., a side door, in particular a sliding door, or an engine hood. Further, in the context of the invention, the device can also be used for actuating a sliding roof, a car window, a folding top, or an adjustable vehicle part in the vehicle interior, such as, for example, a vehicle seat or its back rest, without the invention being limited thereto.

Further scope of applicability of the present invention will become apparent from the detailed description given hereinafter. However, it should be understood that the detailed description and specific examples, while indicating preferred embodiments of the invention, are given by way of illustration only, since various changes, combinations and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 3 shows a detail of the bumper according to FIG. 1 with a view of one of the two mounting surfaces to which the two sensor electrodes of the associated proximity sensor are attached;

FIG. 4 in a schematic illustration shows a top plan view of the sensor electrodes according to FIG. 2, with a view in a vertical direction (Z-direction);

DETAILED DESCRIPTION

Figure 1:
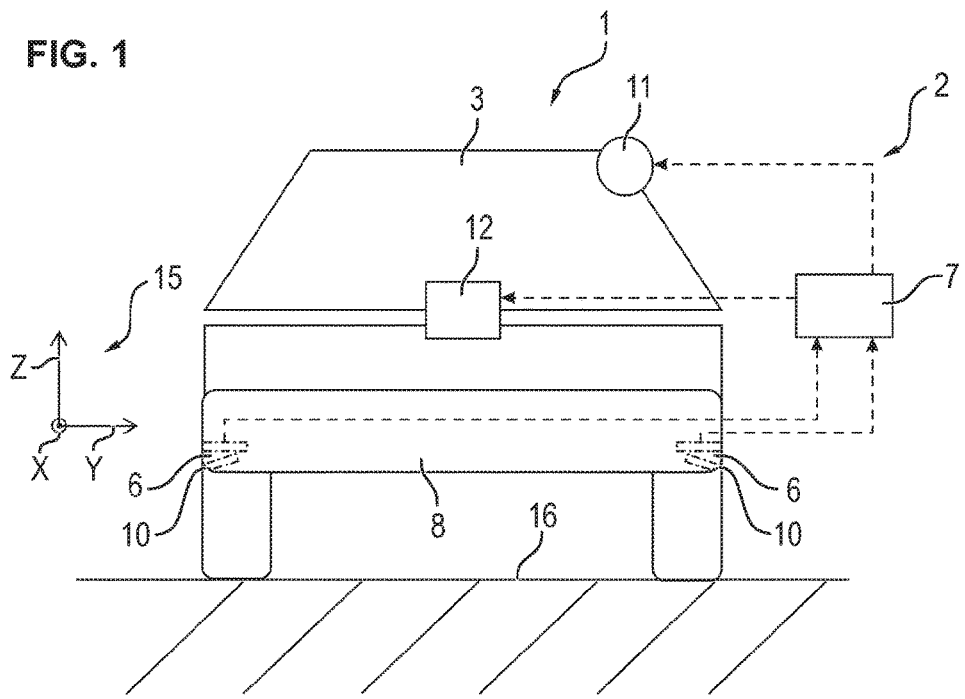
FIG. 1 in a rough schematic illustration shows a motor vehicle having a bumper to which proximity sensors for the contactless actuation of a trunk lid of the motor vehicle are attached.

FIG. 1 shows a (motor) vehicle 1, which is shown in the viewing direction toward its rear section. Vehicle 1 comprises a device 2 for the contactless actuation of a motor-driven vehicle part, here its trunk lid 3. Device 2 comprises two capacitive proximity sensors 6. Furthermore, device 2 comprises a control and evaluation unit 7. A rear bumper 8 is attached to vehicle 1. On said bumper 8 proximity sensors 6 are arranged in corner areas 10, which terminate the bumper in the vehicle cross direction. The position of the proximity sensors in this case is shown in the figure only in a grossly schematically simplified form.

A user request or actuation command, detected by one of the proximity sensors 6, is output to control and evaluation unit 7, whereupon control and evaluation unit 7 activates a hatch drive 11 and/or a door lock 12 of vehicle 1 to open or close trunk lid 3 according to the user request.

For orientation, a Cartesian vehicle coordinate system 15 is inserted in FIG. 1. The X-axis of this coordinate system hereby designates the vehicle longitudinal direction X and is oriented parallel to a ground 16 on which vehicle 1 is standing. (In the illustration according to FIG. 1, the X-axis points out of the plane of the drawing.) The Y-direction of the vehicle coordinate system 15 indicates the vehicle cross direction Y and is also oriented parallel to ground 16. The vehicle longitudinal direction X and the vehicle cross direction Y therefore span a horizontal plane. The Z-axis of the coordinate system lastly points in the direction of a vehicle vertical Z and is therefore perpendicular to ground 16 and the horizontal parallel thereto. The abovementioned directions are also used hereinafter to describe the spatial orientation of parts in their intended installed position in the motor vehicle.

Figure 2:
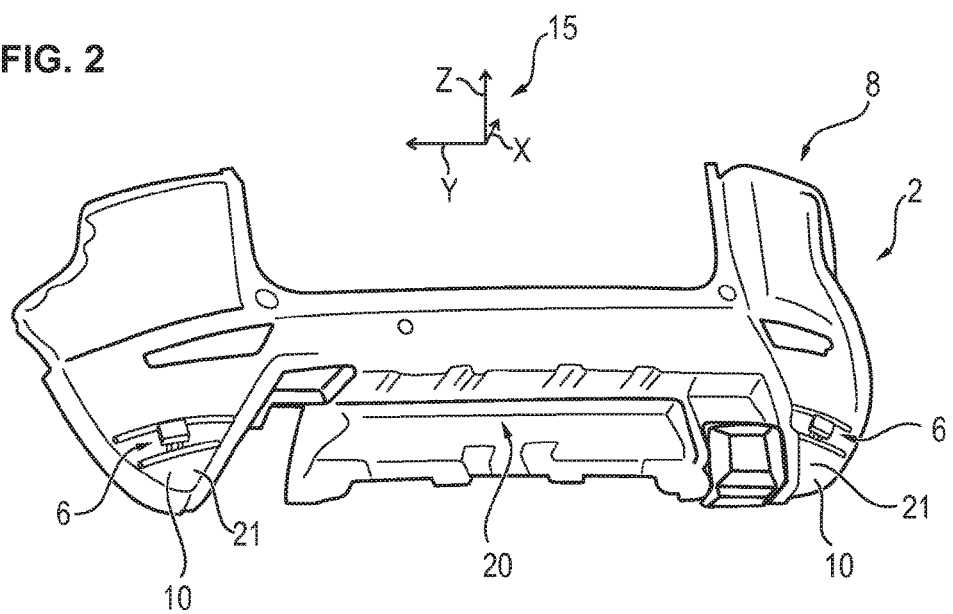
FIG. 2 in a perspective detail illustration shows the bumper according to FIG. 1 with a view of its inner side, in the corner areas of which a curved mounting surface is formed for fastening one proximity sensor in each case.

FIG. 2 shows bumper 8 according to FIG. 1, the viewing direction here being approximately in the vehicle longitudinal direction X according to FIG. 1. Accordingly, a bumper inner side 20 of bumper 8, the side which in the intended installed state of bumper 8 on vehicle 1 faces vehicle 1, can be seen in FIG. 2. Bumper 8 is formed by a thin-walled, three-dimensional molded part made of plastic. Bumper 8 in broad terms has a trough-like shape, whereby in the installed state it surrounds vehicle 1 partially on the rear and on the side. It emerges from FIG. 2 that the two proximity sensors 6 are located in the two opposite corner areas 10 of bumper 8 in each case on a curved mounting surface 21; each area is formed here directly by a section of bumper inner side 20. Bumper 8 in the exemplary embodiment is therefore itself used as the carrier component on which proximity sensors 6 are mounted. In an alternative embodiment, deviating from the above, it is provided that proximity sensors 6 are placed on a carrier component that is separate from bumper 8, whereby this carrier component, formed, for example, by a flat molded part, is attached for its part to bumper inner side 20. Then again, it is also possible that the carrier component is attached elsewhere on vehicle 1, for example, on a crossmember of vehicle 1.

FIG. 3 shows one of proximity sensors 6 according to FIG. 2 in a perspective detail illustration. The second proximity sensor 6 is accordingly made mirror-symmetrically.

Mounting surface 21 is curved in two spatial directions and in rough approximation has a convex shape. As a departure from a spherical surface, however, mounting surface 21 has a positionally varying local curvature.

As is evident from the illustration, proximity sensor 6 has a first elongated (sensor) electrode 30, a second elongated (sensor) electrode 31, and an electronic unit 32. Connecting lines, which connect the two electrodes 30, 31 to electronic unit 32, are constructed in a conventional manner.

In the illustrated exemplary embodiment, each electrode 30, 31 is made as a cylindrical, flexible circular electrode in the form of an insulated circular conductor. The circular conductor is in particular a solid wire, a stranded conductor, or the outer conductor of a coaxial cable. The inner conductor, typically provided in a coaxial cable, is optionally omitted or replaced in this case by a core of nonconductive material, in particular plastic.

Electronic unit 32 comprises as an essential component (not explicitly shown) evaluation electronics, which preferably again comprise a microcontroller. The evaluation electronics are accommodated in a housing 35. Suitable plug-in connectors 36 are molded onto housing 35 for contacting the connecting lines. A further plug-in connector 37 is used for connecting a vehicle-side control line, over which, on the one hand, electronic unit 32 communicates with control and evaluation unit 7, and over which, on the other, the electric power necessary for operation is supplied to electronic unit 32. The function of control and evaluation unit 7 alternatively can also be integrated into electronic unit 32. In this case, control and evaluation unit 7 is part of proximity sensor 6.

In the exemplary embodiment illustrated here, electronic unit 32 is screwed onto mounting surface 21 of bumper 8 by means of eyelets 38, formed on housing 35. It can also be attached to bumper 8 in a different way, however, for example, by gluing, riveting, or welding.

Each electrode 30, 31 at a longitudinal end has a plug-in connection 39, which is used for contacting the connecting line. Electrodes 30, 31, and the connecting lines are clipped to mounting surface 21 with use of locking elements further here. Alternatively, electrodes 30, 31 can also be glued onto mounting surface 21.

The two electrodes 30, 31 are placed spaced apart from one another on mounting surface 21, whereby electronic unit 32 is disposed at least approximately between the two electrodes 30, 31. Housing 35 in this case overlaps first electrode 30. Each electrode 30, 31 conforms to the local curvature of mounting surface 21. First electrode 30 lies at least approximately in the horizontal plane spanned by vehicle longitudinal direction X and vehicle cross direction Y, whereas second electrode 31 is placed obliquely relative to first electrode 30 on mounting surface 21, so that its outer end is located closer to ground 16 than the inner end. The two electrodes 30, 31 here enclose approximately an angle of 10° within the curved mounting surface 21. Due to the oblique positioning of electrode 31, a position-dependent electrode distance d increases steadily outwardly over the length of sensor electrodes 30, 31.

First electrode 30 in the straight extended state has a total length L1, which is greater in comparison with length L2 of second electrode 31. A lengthwise overhang between the first electrode and the second electrode is approximately the same at both longitudinal ends of electrodes 30, 31.

Figure 5:
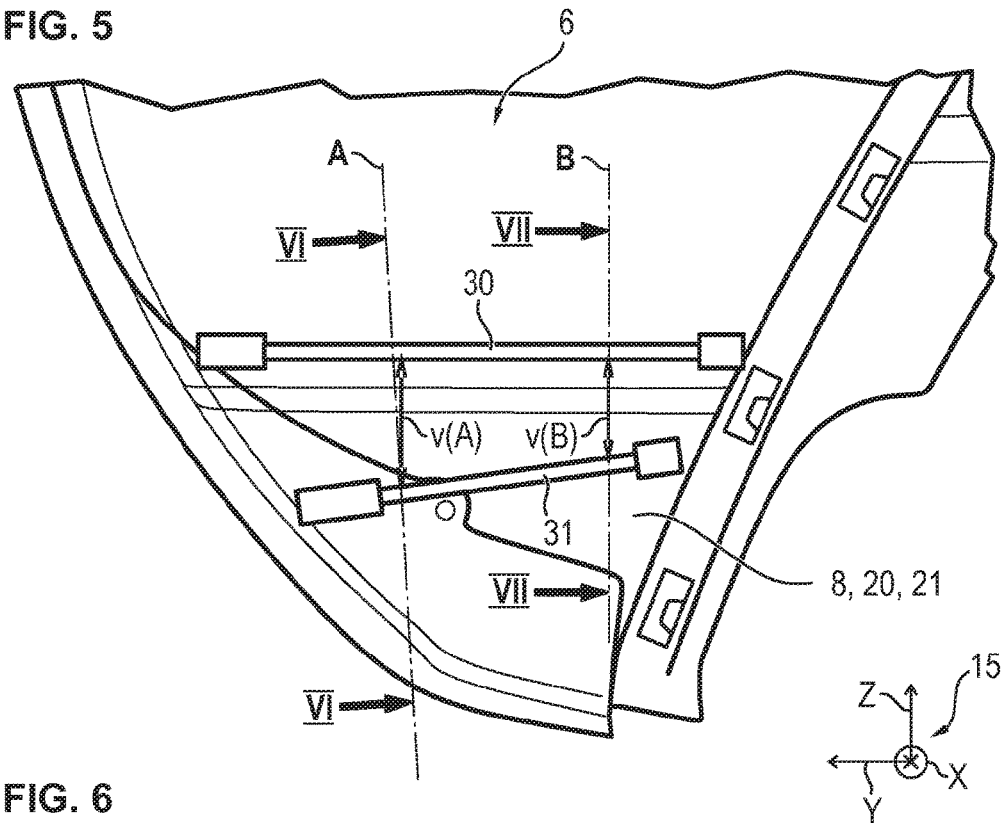
FIG. 5 in a schematic illustration shows a side view of the sensor electrodes according to FIG. 2, with a view in a horizontal longitudinal direction (X-direction) of the motor vehicle.

The position of the two electrodes 30, 31 relative to one another is explained in greater detail below with use of two two-dimensional projections; here FIG. 4 shows a view with a viewing direction opposite to vehicle vertical Z and FIG. 5 shows a view with a viewing direction in vehicle longitudinal direction X. For greater clarity, electronic unit 32 is not shown in these cases.

In the following explanations, the shorter second electrode 31 is defined as a reference electrode. Distances and directions are accordingly indicated as a function of the position along the longitudinal extent of second electrode 31. To this end, electrode 31 is assigned a (curved) position coordinate (or in short 'position') L oriented along its longitudinal extent, whose origin is at its longitudinal end on the plug-in connector side. The direction, which is perpendicular to the direction of position coordinate L and which at each position L is within the horizontal plane perpendicular to the longitudinal extent of sensor electrode 31, is designated as the normal direction N.

Depending on this position coordinate L, the electrode distance d, formed between electrodes 30, 31, constitutes a positionally variable mathematical function d=d(L). In FIG. 3 to FIG. 5, sectional planes VI-VI (for L=A) and VII-VII (for L=B) are shown for two exemplary values A and B of positional coordinate L. The associated sectional cuts are shown in FIG. 6 (for L=A) or FIG. 7 (for L=B).

It is evident from FIGS. 6 and 7 that the electrode distance d can be subdivided into a vertical component, which is oriented in the direction of the vehicle vertical Z and which is designated below as the vertical distance v (with v=v(L)) (also see FIG. 3 and FIG. 5), and into a horizontal component, which is oriented at least approximately in the normal direction N and which is designated below as the horizontal distance h (with h=h(L)) (also see FIG. 3 and FIG. 4).

Figure 6:
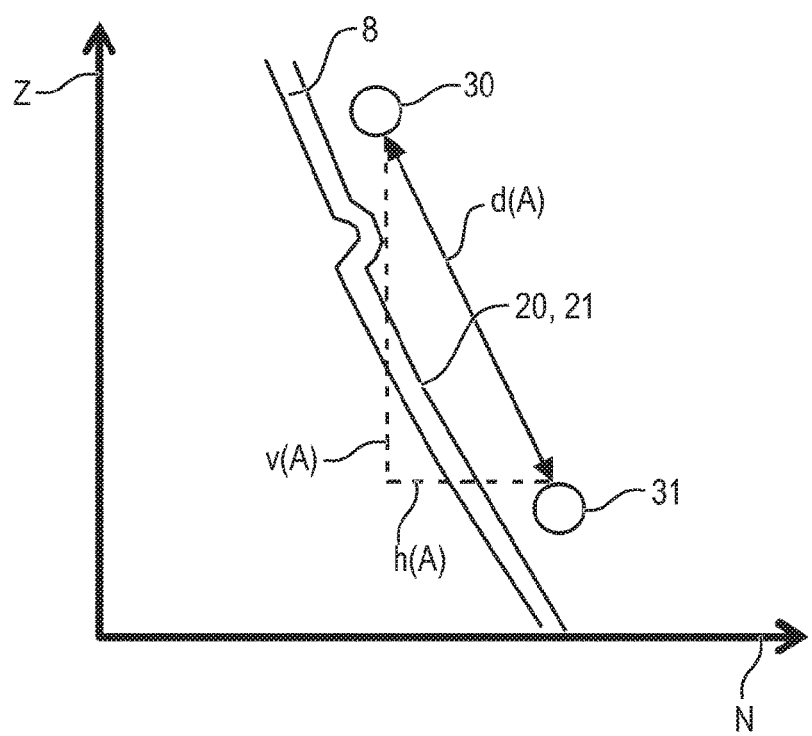
FIG. 6 shows a schematic section VI-VI through the sensor electrodes according to FIG. 3 to FIG. 5 at a first position along the longitudinal extent of the sensor electrodes.

In FIG. 6, the vertical distance v and the horizontal distance h are indicated at the position L=A (v=v(A); h=h(A)). Accordingly, in FIG. 7 the vertical distance v and the horizontal distance h are indicated at the position L=B (v=v(B); h=h(B)).

Figure 7:
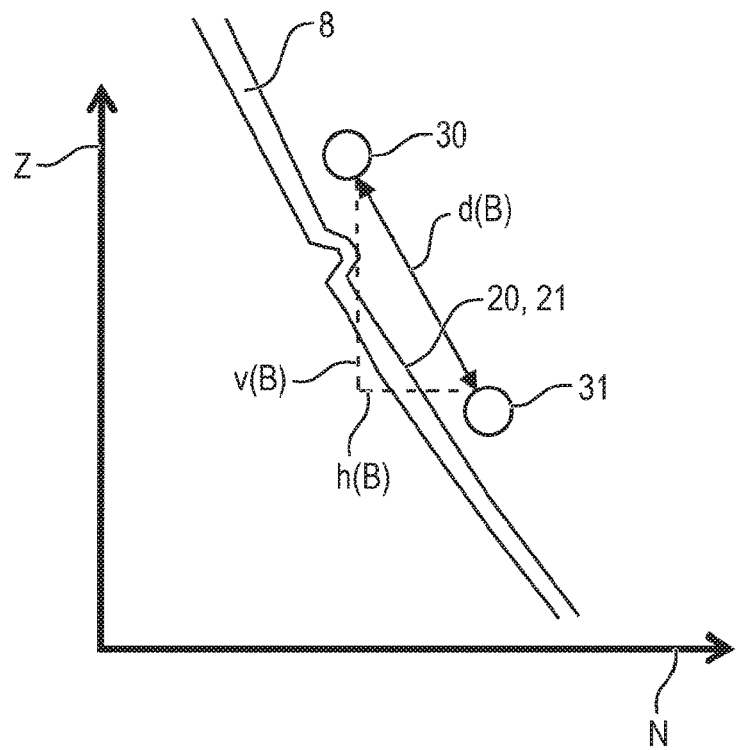
FIG. 7 shows a schematic section VII-VII through the sensor electrodes according to FIG. 3 to FIG. 5 at a second position along the longitudinal extent of the sensor electrodes.
Figure 8:
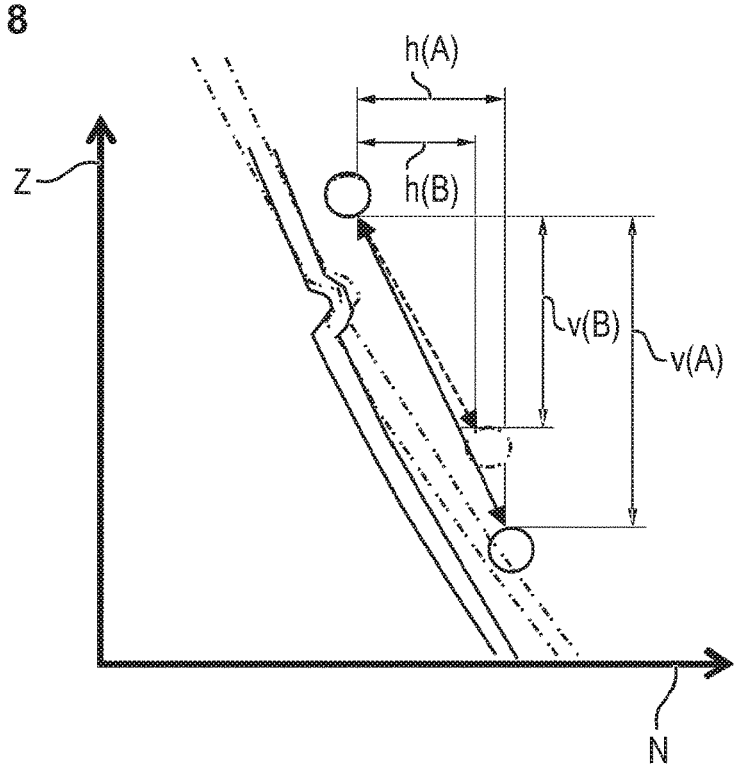
FIG. 8 shows a superimposition of the sectional illustrations similar to FIG. 6 and FIG. 7 for illustrating a maximum allowable horizontal distance between the two sensor electrodes.

In FIG. 8, the sectional cuts according to FIGS. 6 and 7 are illustrated one over the other, whereby the sectional cut according to FIG. 6 (for L=A) is shown using a solid line and the sectional cut according to FIG. 7 (for L=B) using a dashed line. It is evident from this illustration that the horizontal distance h varies only slightly over the length of sensor electrode 31, whereas the vertical distance v is subject to a considerable positional change. In FIGS. 6 and 7, this is clearly evident in that the horizontal distance h is virtually the same at positions L=A and L=B(h(A)≈h(B)), whereas the vertical distance v at position L=A greatly exceeds the vertical distance v at position L=B(v(A)>v(B)).

In the case of suitable dimensioning, sensor electrodes 30 and 31 are placed such that the horizontal distance h deviates by no more than 10% from the average value h* of the horizontal distance h over the length of sensor electrode 31:

$$|h-h^*| \leq 0.1 \cdot h^*$$

with $$h^* = \frac{1}{L2} \cdot \int h(L) dL$$

If this condition is met, thus electrodes 30, 31, as shown in FIG. 4, in a projection on the horizontal plane lie at least approximately on lines which run parallel to one another and which in turn again run approximately parallel to a curved bumper surface 40.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A device for contactless actuation of an adjustable vehicle part of a vehicle, the device comprising:
   a capacitive proximity sensor that comprises a first elongated sensor electrode and a second elongated sensor electrode; and
   a carrier component to fasten the proximity sensor to the vehicle in a specific installation position, the carrier component having a curved mounting surface on which the two sensor electrodes are mounted spaced apart from one another such that in the installed position the vertical component of the electrode distance formed between the first sensor electrode and the second sensor electrode varies along a length of the sensor electrodes, over which the sensor electrodes overlap when viewed transverse to a longitudinal extent of the sensor electrodes, while the horizontal component of the electrode distance is exactly or at least approximately constant along the length of the sensor electrodes,
   wherein the electrode distance is measured at points along the longitudinal extent of one of the sensor electrodes, the electrode distance being a distance between each respective point of the points of the one of the sensor electrodes and an opposing respective point of another of the sensor electrodes that is closest thereto,
   wherein the vertical component of the electrode distance is oriented in a vertical direction perpendicular to the ground, when the carrier component is fastened in the specific installation position, and
   wherein the horizontal component of the electrode distance is oriented in a horizontal direction that is parallel to the ground, when the carrier component is fastened in the specific installation position.

2. The device according to claim 1, wherein the horizontal component of the electrode distance varies by a maximum of 10% from its average value over the length of the sensor electrodes.

3. The device according to claim 1, wherein the vertical component of the electrode distance varies by more than 10% from its average value over the length of the sensor electrodes.

4. The device according to claim 1, wherein each sensor electrode is curved only in one dimension, so that each sensor electrode extends at least approximately within an associated flat plane, and wherein the associated flat plane of the second sensor electrode is positioned obliquely to the associated flat plane of the first sensor electrode.

5. The device according to claim 4, wherein one of the sensor electrodes in the installed state of the device on the vehicle extends within a horizontal plane.

6. The device according to claim 1, wherein the carrier component is formed by a vehicle bumper whose inner side is formed as the mounting surface.

7. The device according to claim 1, wherein the carrier component is formed by a separate flat molded part formed for fastening to a vehicle bumper.

8. The device according to claim 6, further comprising two proximity sensors, wherein each of the two proximity sensors in an installed position is disposed in a curved corner area of the bumper.

9. The device according to claim 1, wherein the device is arranged on the vehicle.

10. The device according to claim 1, wherein the longitudinal extent of the first sensor electrode is greater than the longitudinal extent of the second sensor electrode, such that, in a vehicle cross direction that is parallel to the ground and perpendicular to the longitudinal direction of the vehicle, a first lengthwise overhang and a second lengthwise overhang of the first sensor electrode with respect to the second sensor electrode are provided, the first lengthwise overhang being a length at which a first end of the first sensor electrode extends beyond a first end of the second sensor electrode in the vehicle cross direction toward a first side of the vehicle and the second lengthwise overhang being a length at which a second end of the first sensor electrode extends beyond a second end of the second sensor electrode in the vehicle cross direction towards a second side of the vehicle.

11. The device according to claim 1, wherein the first sensor electrode is spaced apart from the second sensor electrode in a longitudinal direction of the vehicle and wherein the longitudinal direction of the vehicle extends in a direction from a front bumper of the vehicle to a rear bumper of the vehicle.

* * * * *